(12) United States Patent
Spring et al.

(10) Patent No.: US 7,161,208 B2
(45) Date of Patent: Jan. 9, 2007

(54) TRENCH MOSFET WITH FIELD RELIEF FEATURE

(75) Inventors: Kyle Spring, Temecula, CA (US); Jianjun Cao, Torrance, CA (US); Timothy D Henson, Redondo Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/437,984

(22) Filed: May 13, 2003

(65) Prior Publication Data

US 2003/0213993 A1 Nov. 20, 2003

Related U.S. Application Data

(60) Provisional application No. 60/378,173, filed on May 14, 2002.

(51) Int. Cl.
*H01L 29/76* (2006.01)
(52) U.S. Cl. .............. 257/328; 257/330; 257/488; 257/E29.201
(58) Field of Classification Search ........ 257/327–332, 257/367, 488–496, E29.009, E29.01, E29.011, 257/E29.012, E29.017, E29.201
See application file for complete search history.

(56) References Cited

U.S. PATENT DOCUMENTS

| | | | |
|---|---|---|---|
| 4,767,722 A | 8/1988 | Blanchard | 438/700 |
| 4,967,245 A | 10/1990 | Cogan et al. | 438/700 |
| 5,034,785 A | 7/1991 | Blanchard | 438/700 |
| 5,072,266 A | 12/1991 | Bulucea et al. | 438/700 |
| 5,298,442 A | 3/1994 | Bulucea et al. | 438/700 |
| 5,592,005 A | 1/1997 | Floyd et al. | 438/700 |
| 5,665,996 A | 9/1997 | Williams et al. | 438/700 |
| 5,674,766 A | 10/1997 | Darwish et al. | 438/700 |
| 5,910,669 A | 6/1999 | Chang et al. | 438/700 |
| 6,037,632 A * | 3/2000 | Omura et al. | 257/341 |
| 6,069,043 A | 5/2000 | Floyd et al. | 438/700 |
| 6,090,716 A | 7/2000 | Floyd et al. | 438/700 |
| 6,211,018 B1 * | 4/2001 | Nam et al. | 438/270 |
| 6,320,223 B1 | 11/2001 | Hueting et al. | 257/341 |
| 6,342,709 B1 * | 1/2002 | Sugawara et al. | 257/139 |
| 6,511,886 B1 * | 1/2003 | Kim et al. | 438/270 |
| 6,534,828 B1 | 3/2003 | Kocon | 257/341 |
| 6,624,494 B1 * | 9/2003 | Blanchard et al. | 257/493 |
| 6,639,272 B1 * | 10/2003 | Ahlers et al. | 257/328 |
| 6,639,278 B1 * | 10/2003 | Sumida et al. | 257/342 |
| 6,646,304 B1 * | 11/2003 | Tihanyi et al. | 257/341 |
| 6,683,347 B1 * | 1/2004 | Fujihira | 257/341 |
| 6,700,175 B1 * | 3/2004 | Kodama et al. | 257/489 |
| 2003/0085422 A1 * | 5/2003 | Amali et al. | 257/329 |
| 2003/0214011 A1 * | 11/2003 | Jianjun et al. | 257/500 |

* cited by examiner

Primary Examiner—Minh-Loan Tran
(74) Attorney, Agent, or Firm—Ostrolenk, Faber, Gerb & Soffen, LLP

(57) ABSTRACT

A trench MOS-gated semiconductor device that includes field relief regions formed below its base region to improve its breakdown voltage, and method for its manufacturing.

15 Claims, 12 Drawing Sheets

TRENCH MOSFET WITH FIELD RELIEF FEATURE

RELATED APPLICATIONS

The present application relates and claims priority to U.S. Provisional Application No. 60/378,173 filed May 14, 2002.

FIELD OF THE INVENTION

The present invention relates to a trench MOSFET and more specifically to a trench MOSFET having improved Idss leakage and breakdown voltage.

BACKGROUND OF THE INVENTION

Trench MOSFETs are well known. Referring to FIG. 1, a conventional trench MOSFET includes a plurality of laterally spaced trenches 6, base region 3, and a plurality of source regions 4 formed in epitaxial layer 20 which is disposed over substrate 1. Base region 3 has a conductivity opposite to that of source regions 4, substrate 1 and drift region 2 (the portion of epitaxial layer 20 between the bottom of trenches 6 and substrate 1), and is disposed between source regions 4 and drift region 2. Typically, epitaxial layer 2 is lightly doped relative to substrate 1.

The controllable gate structure of a typical trench MOSFET includes polysilicon gate electrodes 5 which are disposed inside trenches 6 and electrically isolated from source regions 4, base region 3, and drift region 2 by a layer of gate oxide 15. In the example shown by FIG. 1, substrate 1, drift region 2, and source regions 4 include N type dopants, while base region 3 includes P type dopants. The polarity of these regions is noncritical and may be reversed.

A typical trench MOSFET also includes high conductivity contact regions 8 of the same conductivity as base region 3, but of higher concentration of dopants, formed in epitaxial layer 20 between source regions 4. High conductivity contact regions 8 and source regions 4 are in ohmic contact with source contact 9 which is formed of a suitable contact metal such as Al or AlSi. It should be noted that source contact 9 is insulated from gate electrodes 5 by insulation interlayers 7 which may be formed from an oxide. A conventional trench MOSFET also includes drain contact 10 which is in ohmic contact with substrate 1. A trench MOSFET operates by applying an appropriate voltage to gate electrode 5 in order to create invertible channels in base region 3 adjacent the side walls of trenches 6 to electrically connect source regions 4 to drift region 2, thereby electrically connecting source contact 9 to drain contact 10.

Referring to FIG. 2, when the trench MOSFET of FIG. 1 is reverse biased electric field crowding is observed near the bottom corners of the trenches as schematically shown. The crowding of the field lines create high electric fields that can cause breakdown to occur near the gate oxide interface resulting in hot carrier injection into the gate oxide, breakdown voltage walkout and an unreliable gate oxide.

Under reverse biased conditions, the p-n junction between drift region 2 and base region 3 depletes back into base region 3. If the depletion layer reaches high conductivity regions 8 defects such as stacking faults provide a path for the leakage current Idss. To avoid this result base region 3 may be made sufficiently thick or its resistivity manipulated to improve the breakdown voltage rating of the device. This solution may not be ideal in all cases, however, because increasing the thickness and resistivity of base region usually leads to the increase of ON resistance, Rdson, which is undesirable.

Another known trench MOSFET is shown in FIG. 3. In this trench MOSFET like numerals identify the same features as those described earlier with respect to the trench MOSFET of FIG. 1. The trench MOSFET shown in FIG. 3 includes a deep high conductivity region 11 which is of the same conductivity type as, and extends below, base region 3 into drift region 2.

Deep high conductivity region 11 is formed through a high dose, implant and drive at the initial stages of the MOSFET fabrication process. FIG. 4 shows a plot of the doping concentration along line 4—4 in FIG. 3. The function of deep high conductivity region 11 is to move the location of breakdown away from the bottom corners of trenches 6 to the bottom of deep high conductivity region 11.

Deep high conductivity region 11 is usually as wide as it is deep which is disadvantageous in that it severely limits the cell pitch that is achievable (smaller cell pitches typically result in lower on-resistance). Also, the breakdown voltage rating is not improved by the inclusion of deep high conductivity region 11, and may be in fact reduced despite the fact the location of the breakdown is moved from the corners of the trenches to the bottom of the deep high conductivity region 11.

SUMMARY OF THE INVENTION

A trench MOSFET according to the present invention includes field relief regions formed in the drift region at a location below the base region. The field relief regions may be spaced from or may merge with the base region.

The field relief regions are formed through high energy, low dose implantation. The advantages to inclusion of field relief regions are:

a) increase in the breakdown voltage and lowering of the on-resistance;

b) better reliability by removing the high electric fields away from the corners of the trenches;

c) reduction of the Idss leakage current by preventing the base diode from depleting back and reaching the high conductivity contact regions where defects such as stacking faults may provide a path for the leakage current;

d) providing better latitude for trench etch and contact etch by making the breakdown voltage and Idss leakage less sensitive to trench etch depth variation and contact etch depth variation.

Other features and advantages of the present invention will become apparent from the following description of the invention which refers to the accompanying drawings.

DETAILED DESCRIPTION OF EMBODIMENTS OF THE INVENTION

Figure 5:
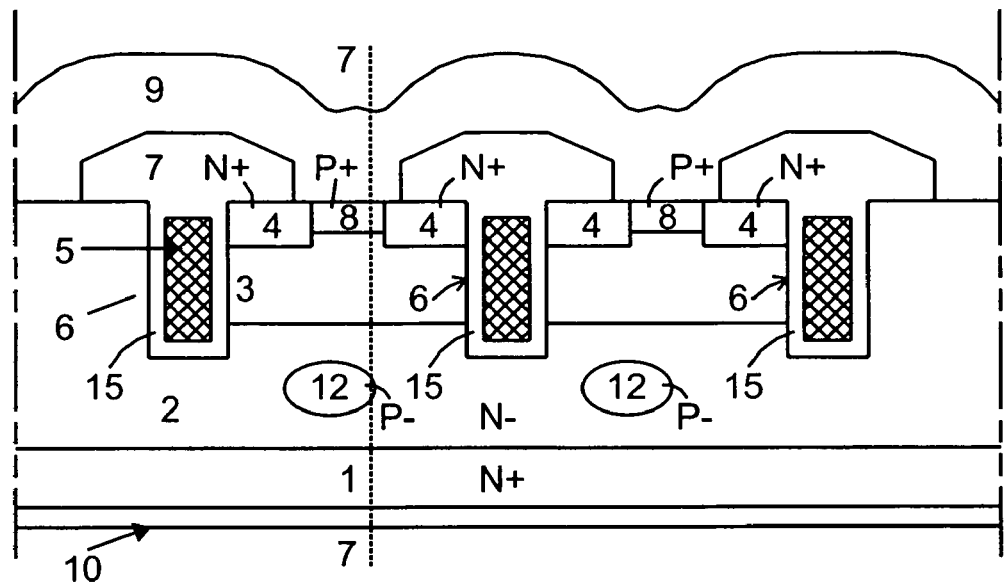
FIG. 5 shows a cross-sectional view of a portion of the active area of a trench MOSFET according to the first embodiment of the present invention.

FIG. 5 shows the cross section of a trench MOSFET according to the first embodiment of the present invention. The numerals shown in FIG. 5 identify the same features as those described with reference to FIG. 1 and will not be described here again.

Figure 1:
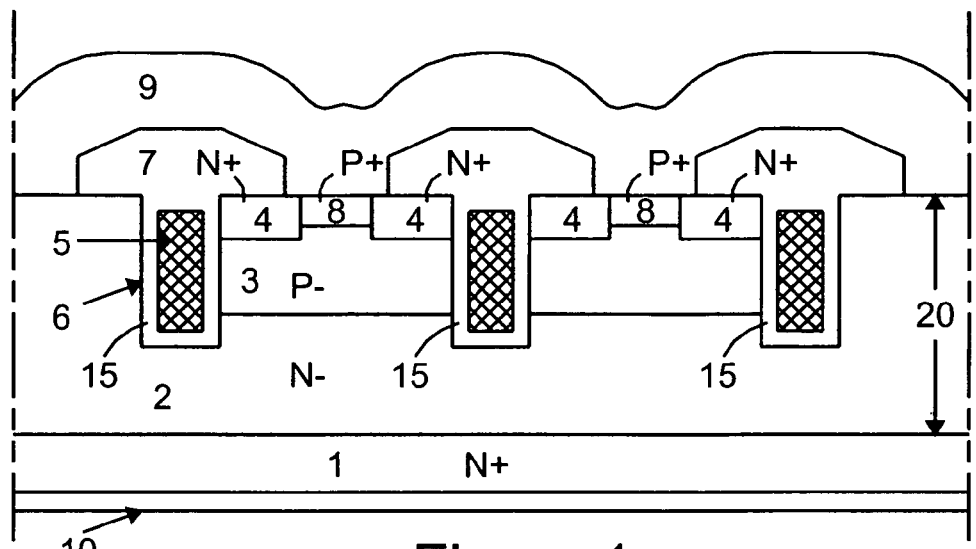
FIG. 1 shows a cross-sectional view of a portion of the active area of a trench MOSFET according to prior art.
Figure 2:
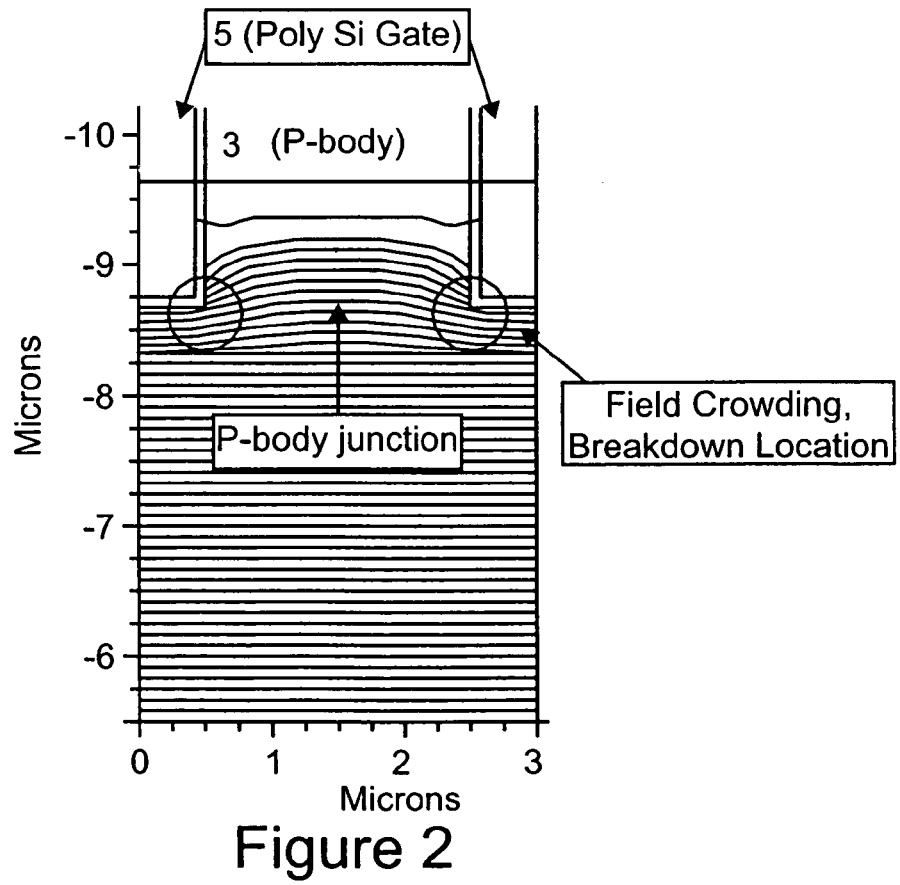
FIG. 2 shows the relative positions of the electric field lines in the MOSFET of FIG. 1 under reverse bias.
Figure 13:
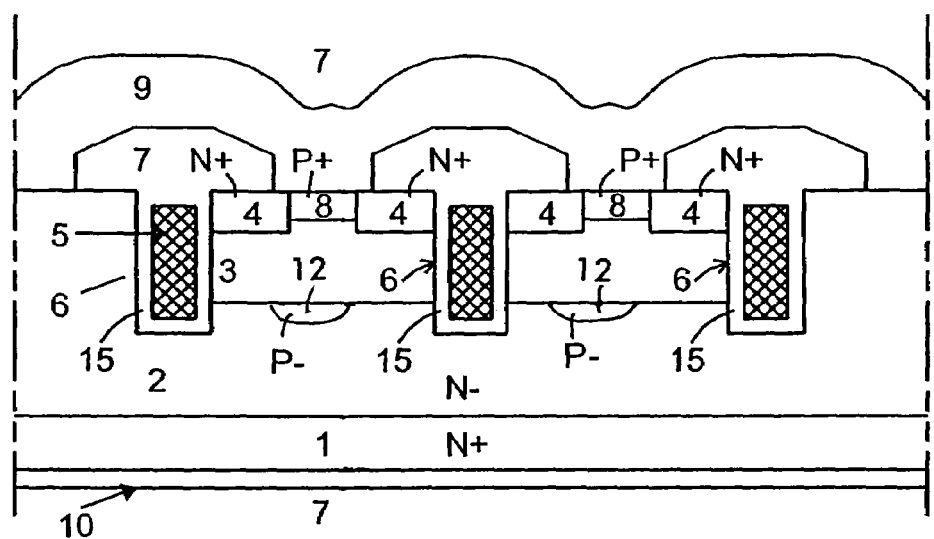
FIG. 13 shows a cross-sectional view of a portion of the active area of a trench MOSFET according to a third embodiment of the present invention.

A trench MOSFET according to the present invention is different from the known trench MOSFETs shown by FIGS. 1 and 3 in that it includes field relief regions 12 which extend into drift region 2 below base region 3. Field relief regions 12 are lightly doped with dopants of the same conductivity type as those in base region 3, and may be spaced from or may merge with base region 3 (see FIG. 13). In the example shown by FIG. 5, field relief regions include P type dopants such as boron.

Figure 6:
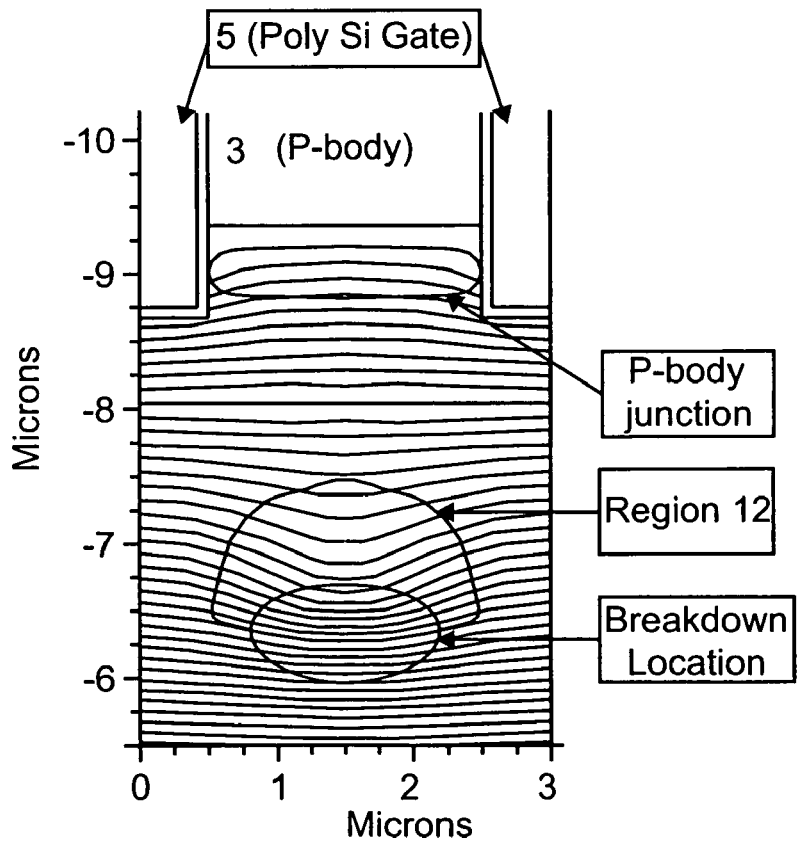
FIG. 6 shows the relative positions of the electric field lines in the MOSFET of FIG. 5 under reverse bias.

Referring to FIG. 6, field relief regions 12 move the location of breakdown away from the bottom corners of trenches 6 and into the regions below field relief regions 12, which improves reliability and reduces the sensitivity of the device to trench depth variation. In addition, the distance between the p-n junction of drift region 2 and field relief region 12 to high conductivity contact regions 8 is increased, which reduces the possibility of the depletion region reaching high conductivity contact regions 8 under the reverse bias condition to avoid excessive leakage current.

Figure 3:
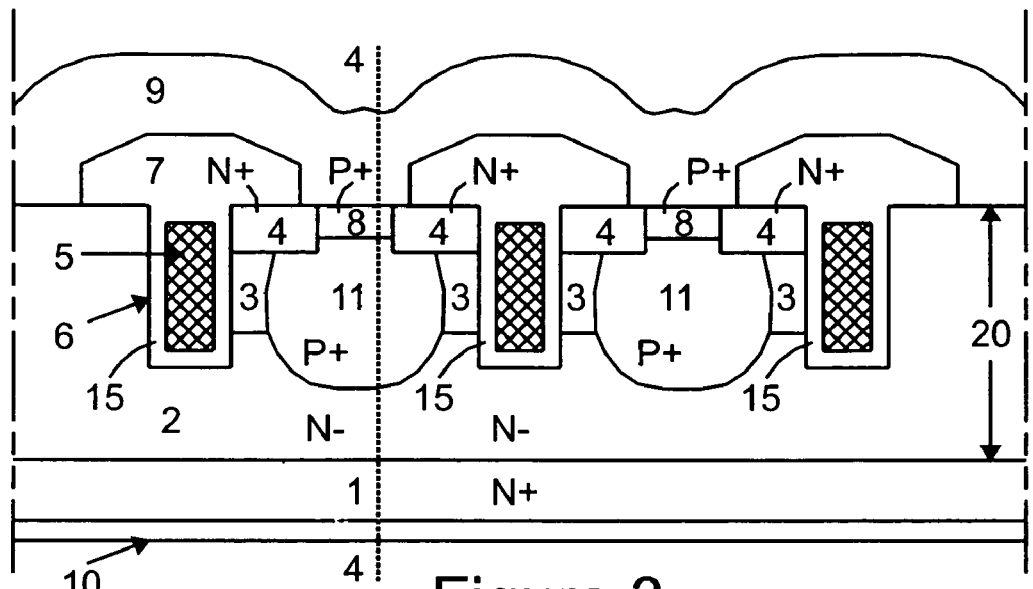
FIG. 3 shows a cross-sectional view of a portion of the active area of a trench MOSFET according to prior art.
Figure 4:
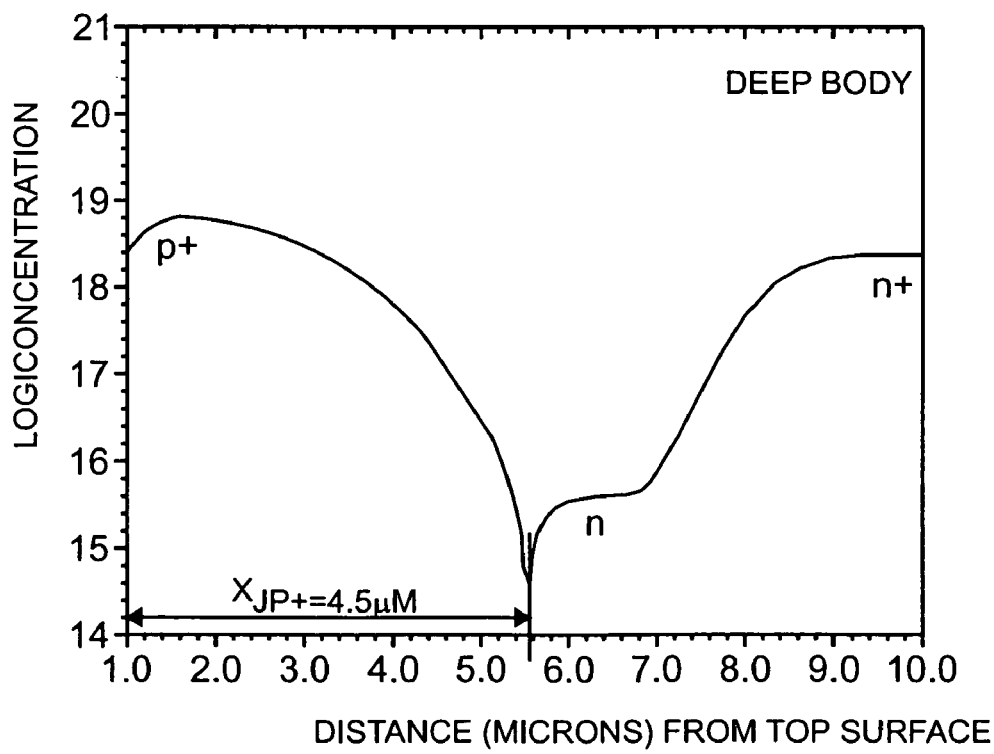
FIG. 4 shows a dopant concentration profile of the MOSFET of FIG. 3 along line 4—4.
Figure 7:
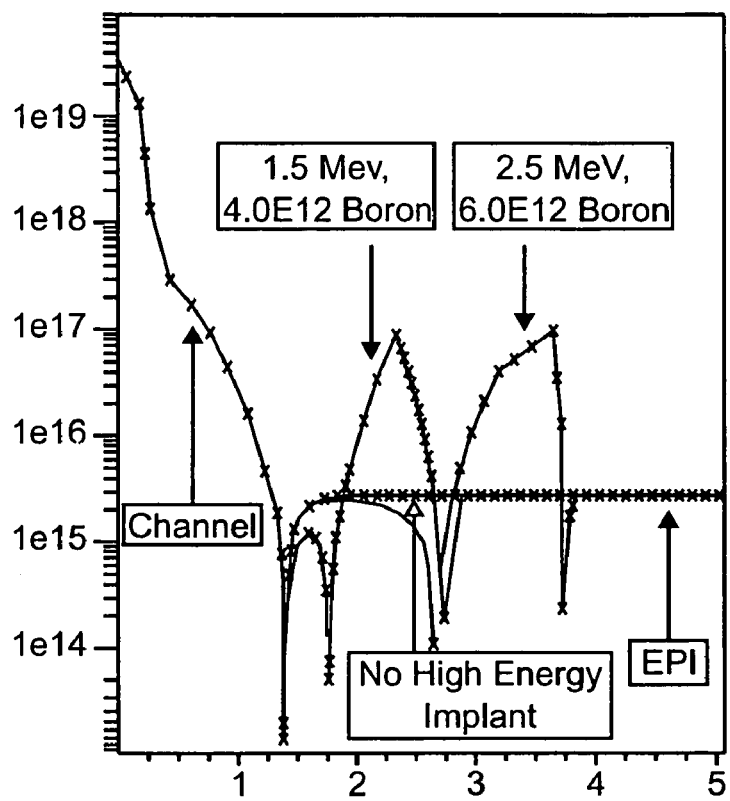
FIG. 7 shows a dopant concentration graph of the MOSFET of FIG. 5 along line 7—7.

The doping concentration and relative dimensions of deep high conductivity regions 11 (FIG. 3) and field relief regions 12 can be compared by reference to FIGS. 4 and 7, which respectively show doping profiles as seen along lines 4—4 in FIGS. 3 and 7—7 in FIG. 5. FIG. 7 shows the concentration profile of a device along line 7—7 when there is no field relief regions 12, with field relief regions 12 formed by implantation of 4.0E12 of dopants at 1.5 MeV, and field relief regions 12 formed by implantation of 6.0E12 at 2.5 MeV. It can be seen in FIG. 7 that the dopant concentration in field relief regions 12 is low (approximately 1.0E17 atoms/cm^3) and field relief regions 12 are primarily beneath base region 3.

Referring to FIG. 4, the dopant concentration in deep high conductivity regions 11 of the prior art device of FIG. 3 is relatively high, and starts at the top surface of epitaxial layer 20 and continues, in a typical device, to a depth of about 4.5 um (below base region 3). Because deep high conductivity regions 11 are formed through a diffusion step their width is approximately the same as their depth. Thus, deep high conductivity regions 11 may limit the cell pitch.

On the other hand, field relief regions 12 are formed through a single high energy, low dose implant, or multiple high energy, low dose implants followed by a short thermal step to only activate the dopants without much consequent diffusion. In addition, the width of field relief regions 12 can be controlled during the manufacturing of the device by controlling the width of implant windows as will be explained later. As a result, the final width of field relief regions 12 can be controlled which allows for a reduction in the cell pitch.

Figure 8:
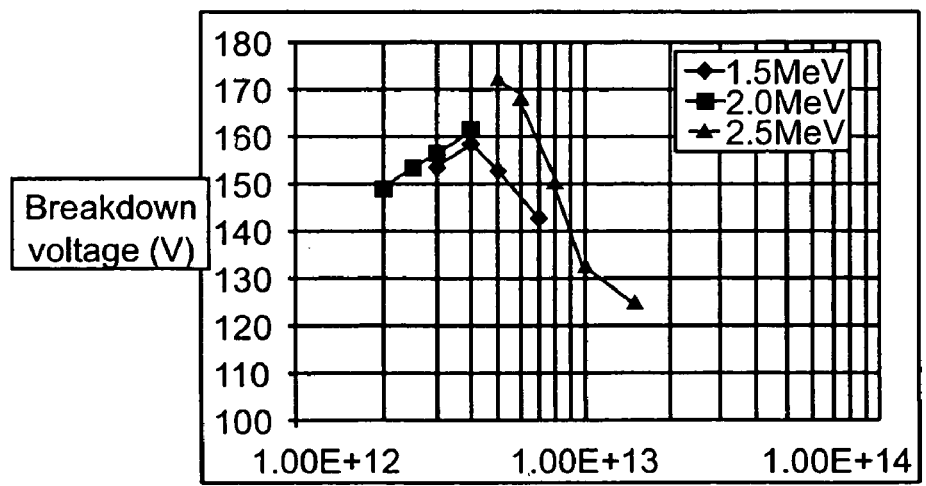
FIG. 8 graphically shows the breakdown voltage characteristics of a trench MOSFET according to the present invention.

FIG. 8 shows the simulated breakdown voltages for trench MOSFETs with field relief region 12 according to the present invention. As seen in FIG. 8, the value of the breakdown voltage in a device according to the present invention is increased when the concentration of field relief regions 12 is appropriately chosen. It should be noted that breakdown voltage is reduced when the dopant concentration of field relief regions 12 is too high. Also, it should be noted that the depth of the field relief regions 12 may have an effect on the breakdown voltage. For example, at higher concentrations, deeper field relief regions 12 (e.g. 2.5 MeV) increase the breakdown voltage compared to shallower field relief regions (e.g. 2.0 MeV).

Table 1 includes data which show that a trench MOSFET according to the present invention has a lower on-resistance and improved reliability.

TABLE 1

| Example | EPI ohm-cm | High Energy Implant MeV | Breakdown Voltage (normalized) V | Rdson* Reduction % |
|---|---|---|---|---|
| 1 | 1.9 | none | 117 | |
| 2a | 2.25 | none | 131 | |
| 2b | 1.9 | 1.5 | 131 | 16% |
| 3a | 2.54 | none | 143 | |
| 3b | 1.9 | 2.5 | 143 | 25% |

*Rdson reduction (2b, 3b) compared to prior art (2a, 3a).

For example, an on-resistance reduction of 25% has been obtained through simulations where the energy of the implant used to form field relief regions 12 is 2.5 MeV and the dose is 6.0E12.

Referring to FIGS. 9(*a*) to 9(*d*), the manufacturing process of a trench MOSFET according to the present invention will now be described. Referring first to FIG. 9(*a*), base region 3 is formed by implantation of P type dopants such as boron into an area in epitaxial layer 20 that is selected to become the active area followed by an appropriate diffusion drive to obtain a base region 3 with a desired depth.

Referring next to FIG. 9(*b*), trenches 6 are formed in epitaxial layer 20 to extend from the top surface of epitaxial layer 20 through base region 3 down to drift region 2. Source regions 4 are then formed through a photolithographic step or the like. It is also possible to form the source region 4 before forming trenches 6 by a blanket implantation of N type dopants followed by a diffusion drive.

After formation of trenches 6, a layer of gate oxide 15 is grown to line the inside of trenches 6, followed by the deposition of a layer of polysilicon gate material. The layer of polysilicon gate material is then etched leaving polysilicon gate electrodes 5 in trenches. Thereafter, a layer of oxide 13 is deposited.

Referring to FIG. 9(*c*), a layer of photoresist 17 is then deposited over the structure shown by FIG. 9(*b*) and through photolithography windows 19 are opened in the layer of oxide 13 leaving insulation interlayers 7. Through windows 19 in oxide 13 (i.e. the space between insulation interlayers 7) dopants of the same conductivity type as base region 3 are implanted at low energy and high concentration to form high conductivity contact regions 8, and at high energy and at low concentration followed by an appropriate thermal diffusion drive to form field relief regions 12. Typical values for the low-energy, high-dose boron implant are from 2 KeV to 60 KeV and from 5E14 to 5E15 ions/cm$^2$. The typical values for the high-energy, low-dose boron implants are from 200 KeV to 3 MeV and from 1E11 to 1E13 ions/cm$^2$. The sequence of these two implants is not important. Also, the implants can be done with or without the contact mask photo resist on the wafer.

It should be noted that field relief regions 12 may be formed by a single high energy low concentration implantation step or multiple high energy, low concentration implantation steps. It should also be noted that the high energy implants can be exposed to a thermal step that is adequate to activate the dopants without causing much diffusion and consequent expansion.

Figure 9A:
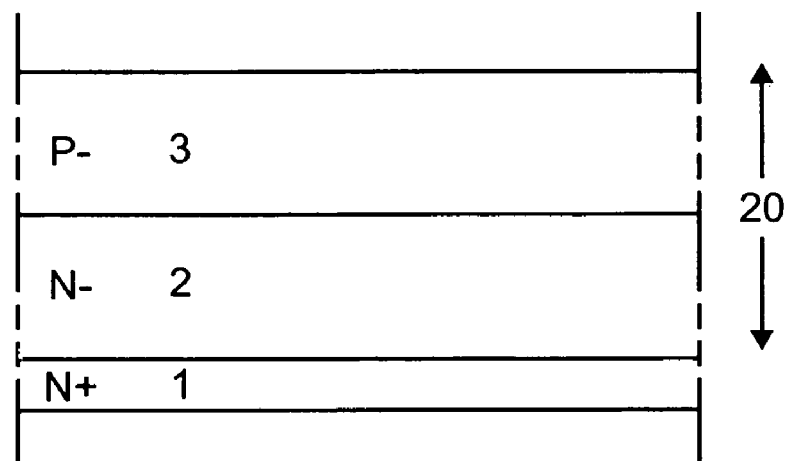
FIGS. 9(*a*)–9(*d*) illustrate a sequence of steps in producing a trench MOSFET according to the first embodiment of the present invention.
Figure 9B:
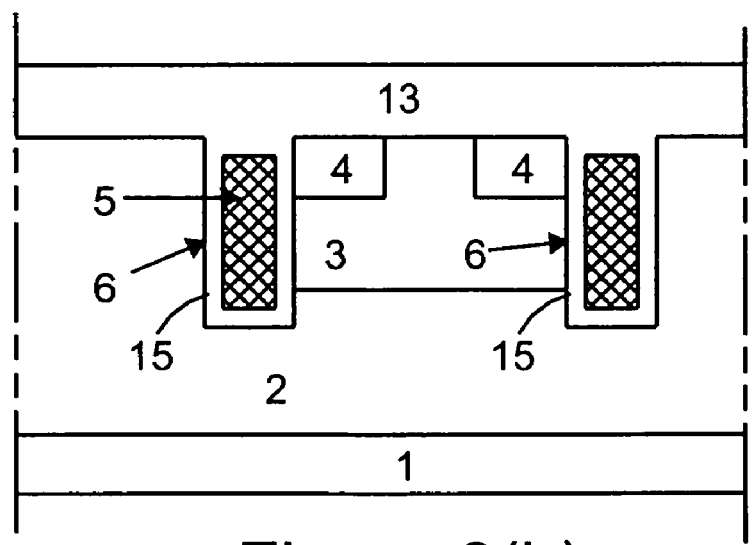
Figure 9C:
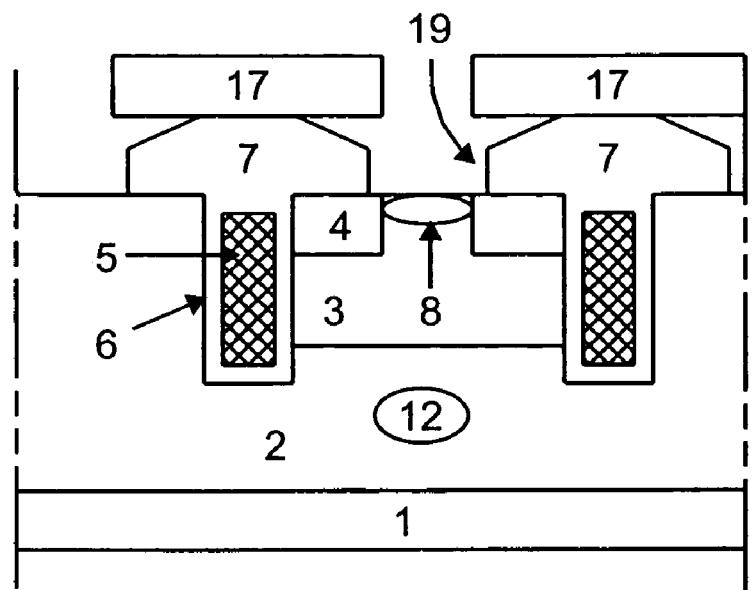
Figure 9D:
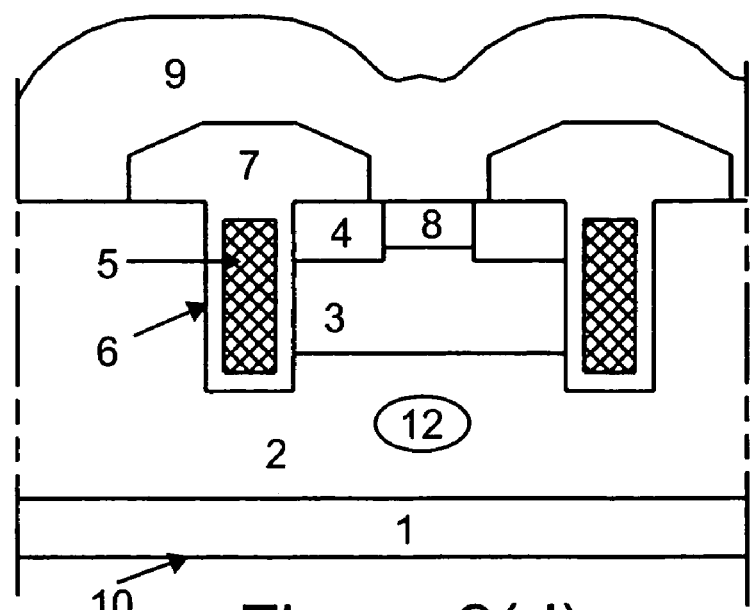

Referring next to FIG. 9(d), source contact 9 and drain contact 10 are then formed according to any known method to obtain a device according to the present invention.

Figure 10:
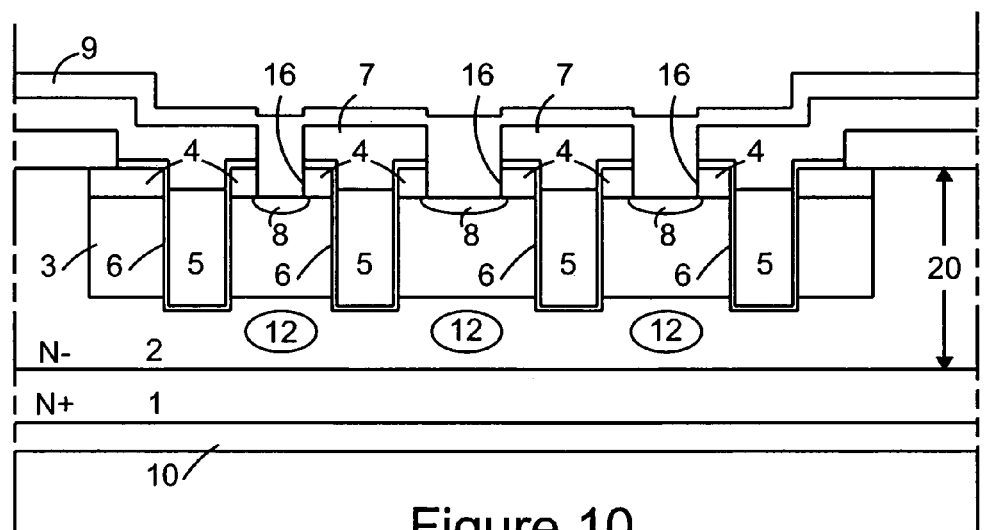
FIG. 10 shows a cross-sectional view of a portion of the active area of a trench MOSFET according to the second embodiment of the present invention.

Referring now to FIG. 10, a trench type MOSFET according to the second embodiment of the present invention includes all of the features of the first embodiment except that it includes recess 16 formed in epitaxial layer 20. High conductivity contact regions 8 are formed at the bottom, and source regions 4 are located at the sidewalls of each recess 16.

A trench MOSFET according to the second embodiment of the present invention is manufactured according to the following process.

Figure 11A:
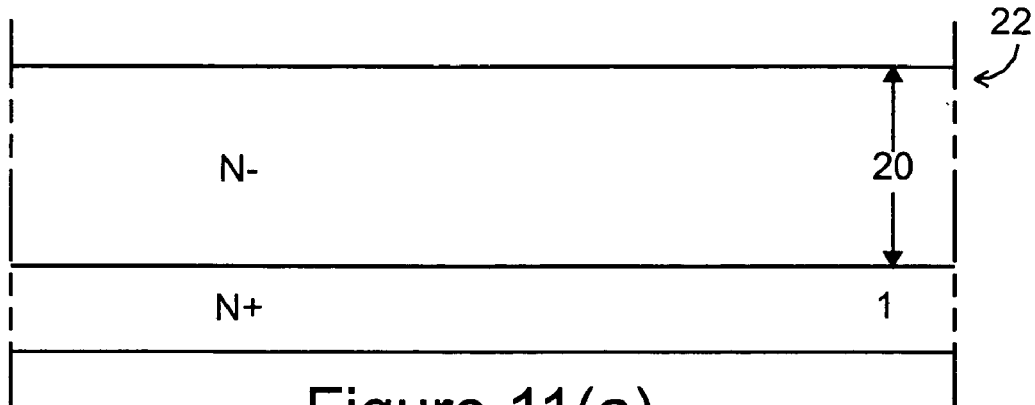
FIGS. 11(*a*)–11(*i*) illustrate a sequence of steps for producing a trench MOSFET according to second embodiment of the present invention.
Figure 11B:
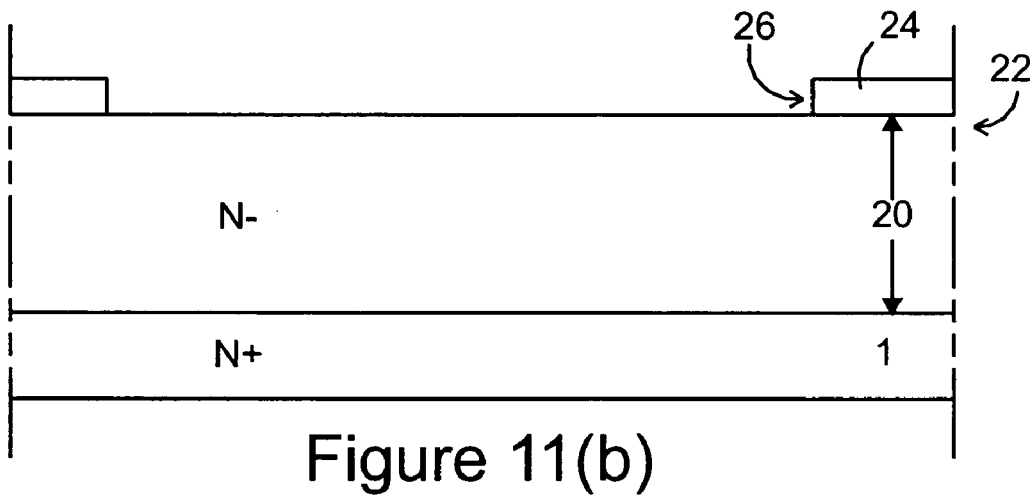

Referring first to FIGS. 11(a) and 11(b), die 22 which includes epitaxial layer 20 over substrate 1, receives a layer of field oxide 24. Through appropriate masking and etching window 26 is opened in the layer of field oxide 24 exposing an area on the top surface of epitaxial layer 20 which will become the active area of the device.

Figure 11C:
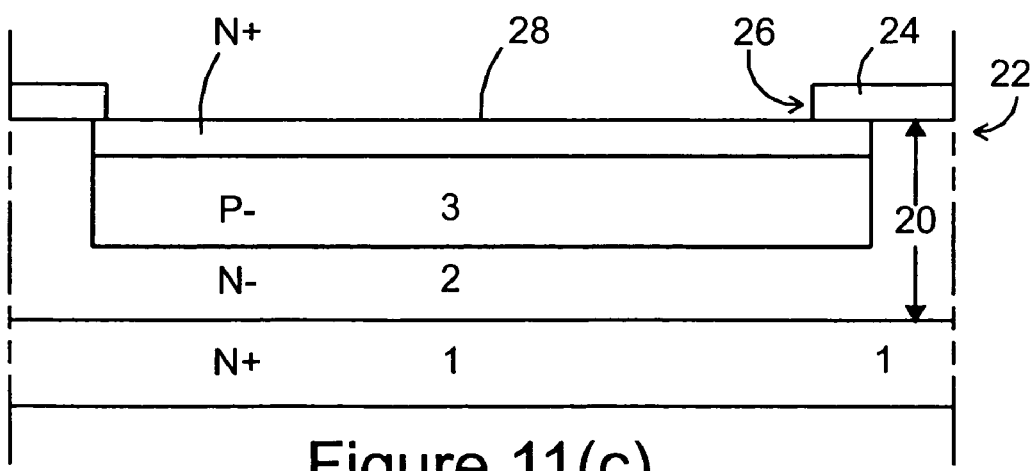

Referring next to FIG. 11(c), dopants of opposite conductivity to the conductivity of epitaxial layer 20 are implanted through window 26 into epitaxial layer 20. Next, dopants of the same conductivity type as the conductivity of epitaxial layer 20 are implanted in epitaxial layer 20 through window 26. Thereafter, die 22 is subjected to a diffusion drive step to form base region 3, and source layer 28.

Figure 11D:
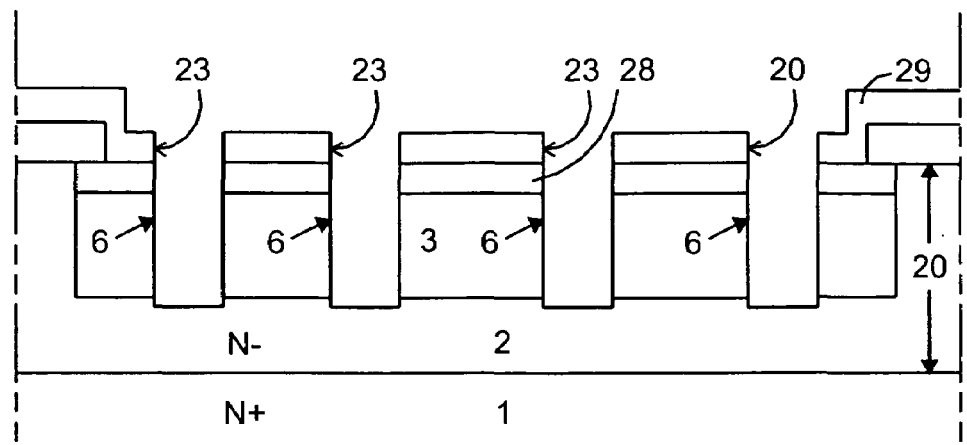

Referring next to FIG. 11(d), a photo resist layer 29 is deposited atop the structure shown by FIG. 11(c), and a mask is created through photolithography which includes window 23. Trenches 6 are then formed through window 23 in epitaxial layer 20 by etching. Trenches 6 are formed to extend to a depth below base region 3.

Figure 11E:
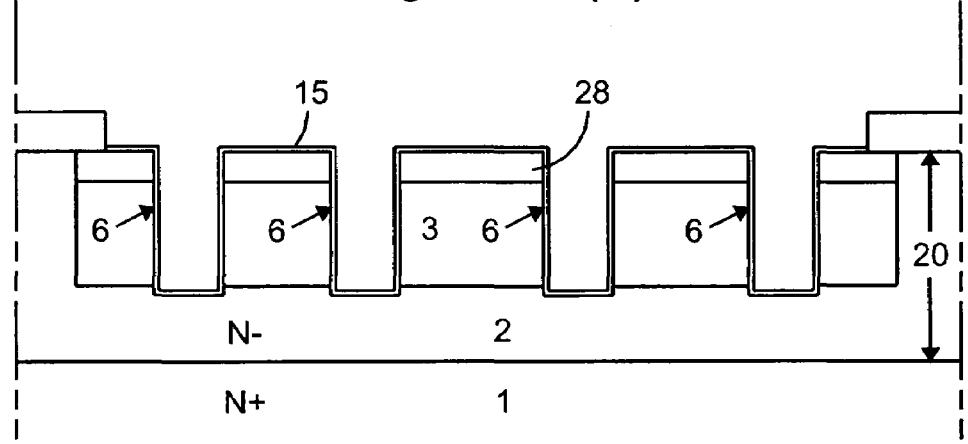
Figure 11F:
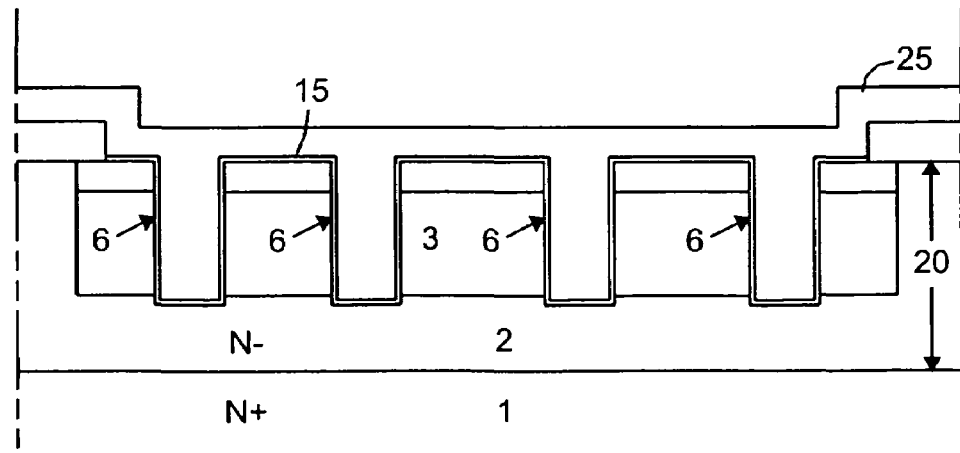

Referring to FIG. 11(e), a layer of gate oxide 15 is grown over the exposed portions of the epitaxial layer 20 including the bottom and the side walls of trenches 6. Gate electrodes 5 are then formed inside each trench 6 by first depositing a layer of polysilicon 25 over the top of die 22 as seen in FIG. 11(f), and etching the same until the desired amount of polysilicon is left in each trench 6 to form gate electrode 5 as shown in FIG. 11(g).

Figure 11G:
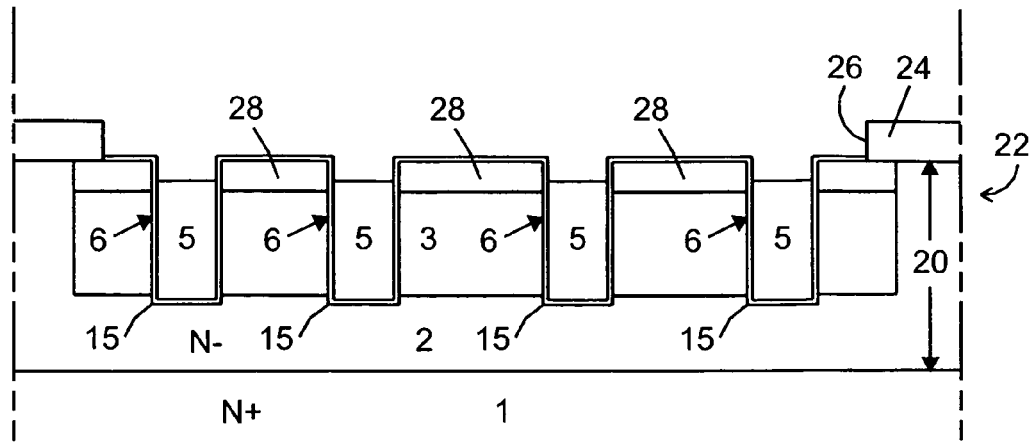
Figure 11H:
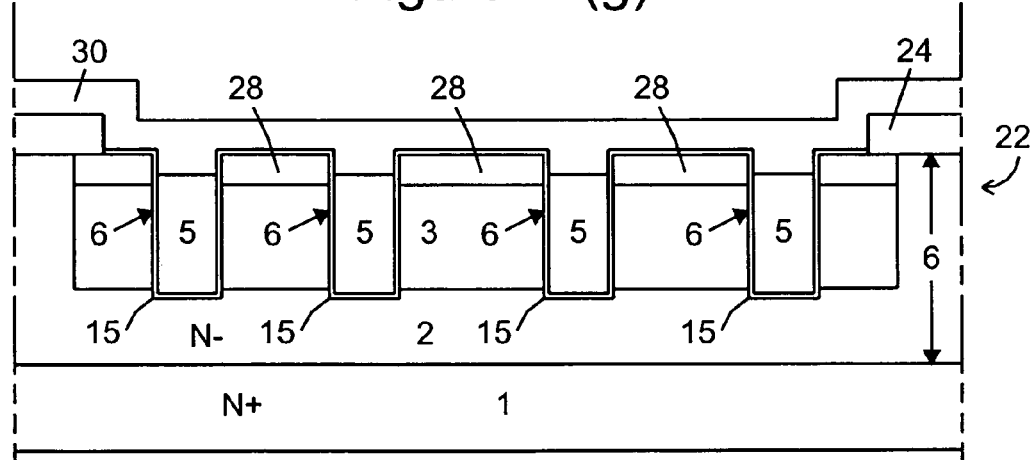
Figure 11I:
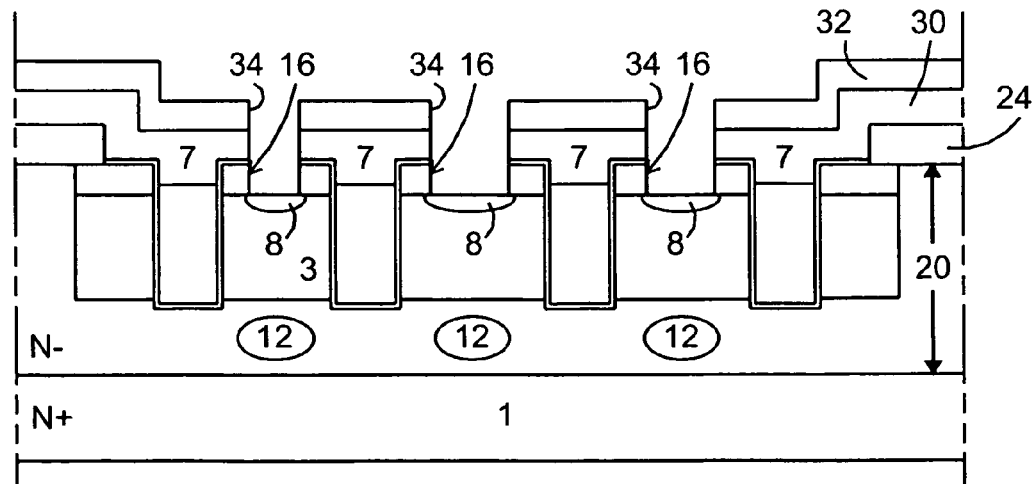

Referring next to FIG. 11(h) and FIG. 11(i), a layer of oxide 30 is deposited atop the structure shown by FIG. 11(g) and densified. Next, a photo resist layer 32 is deposited atop the layer of oxide 30, and, through photolithography, a mask is created which includes windows 34. Oxide 30, and the material underlying oxide 30 is then removed through anisotropic etching to create recesses 16, and oxide interlayer 7. It should be noted that recesses 16 extend to a depth below the depth of source layer 28 which results in the creation of source regions 4.

After the formation of recesses 16, a relatively high concentration of implants of the same conductivity as the conductivity of base region 3 are implanted at the bottom of recesses 16 through windows 34. Thereafter, a low concentration of implants of the same conductivity as the conductivity of base region 3 are implanted at high energy to a depth below base region 3 and subjected to a thermal step to form field relief regions 12. It should be noted that the implants at this stage may be subjected to a temperature that activates the implants without any significant outward diffusion which may cause the expansion of field relief regions beyond the boundary of the initial implant. Also, it should be noted that field relief regions may formed by a single implant or multiple implants. After the formation of field relief regions 12, source contact 9 and drain contact 10 are formed according to any known method to obtain a trench MOSFET according to the second embodiment of the present invention as depicted by FIG. 10.

Figure 12:
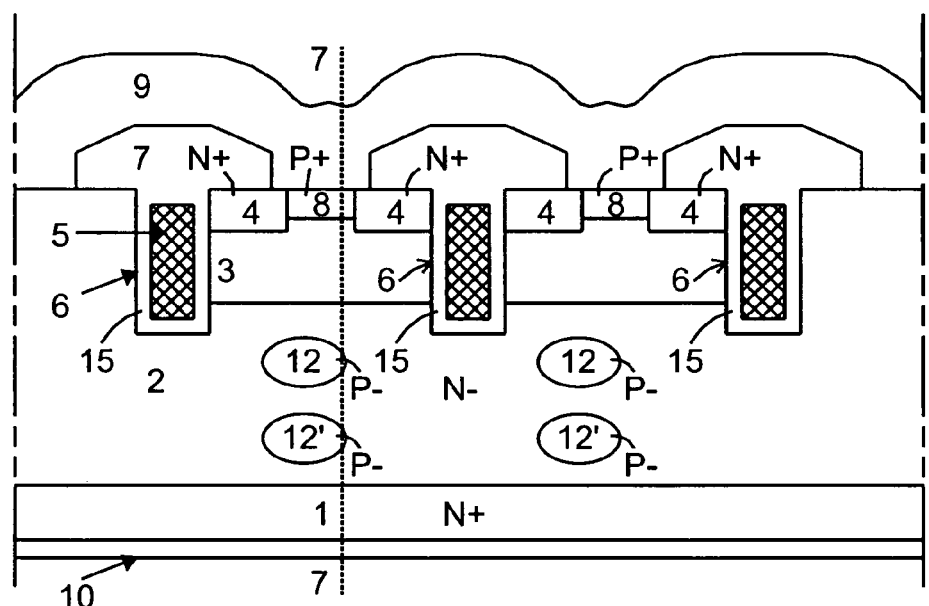
FIG. 12 shows a cross-sectional view of a portion of the active area of a trench MOSFET according to the second embodiment of the present invention.

Referring now to FIG. 12, a trench MOSFET according to the third embodiment of the present invention may include another set of field relief region 12'. Specifically, according to the third embodiment, another set of field relief regions 12' may be formed at a depth below that of the first set of field relief region 12 through a high energy implant to a depth below that of the first set of field relief regions 12 followed by a drive step as described above.

The polarities shown in the embodiments described above are only examples, and may be reversed without departing from the present invention.

A trench MOSFET according to the present invention exhibits improvements in breakdown voltage rating and reduction in Idss leakage.

A further advantage of the present invention is that the width of field relief regions 12 can be made small and well controlled as by controlling the width of windows through which dopants for forming field relief region are implanted. Better control over the size of field relief regions 12 allows for the manufacture of trench MOSFETs having narrow cell pitches and reduced on-resistance.

Another advantage of the present invention is that the value of the breakdown voltage can be adjusted by adjusting the concentration of the dopants in, and the depth of field relief regions 12.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A MOS-gated device comprising:
a substrate of a first conductivity type;
a trench receiving layer which includes a common conduction region of said first conductivity type, and a base region of a second conductivity type formed over said common conduction region;
a plurality of trenches formed to extend below said base region, each trench including a gate insulation layer disposed on at least one side wall thereof and filled with a conductive gate material;
a plurality of source regions each adjacent a respective trench;

a plurality of highly conductive contact regions formed in said base region; and a plurality of field relief regions of said second conductivity formed in said common conduction region and extending to a depth below said base region; wherein each said field relief region is lightly doped, spaced from said base region and said trenches, and aligned with a respective highly conductive contact region, and wherein each of said highly conductive contact regions is formed at the bottom of a respective recess in said base region, and wherein a source region is located at a respective sidewall of each recess.

2. A device according to claim 1, further comprising a source contact in ohmic contact with said source regions.

3. A device according to claim 1, further comprising a drain contact in ohmic contact with said substrate.

4. A device according to claim 1, further comprising another plurality of field relief regions formed in said common conduction region at a depth below said depth of said plurality of field relief regions.

5. A MOS-gated device comprising:
a substrate;
a trench receiving layer which includes a common conduction region of said first conductivity type, and a channel region of a second conductivity type formed over said common conduction region;
a plurality of trenches formed to extend below said channel region, each trench including a gate insulation layer disposed on at least one side wall thereof and filled with a conductive gate material;
a plurality of conductive regions of said first conductivity each adjacent a respective trench;
a plurality of highly conductive contact regions formed in said channel region; and
a plurality of field relief regions of said second conductivity formed in said common conduction region and extending to a depth below said channel region; wherein each said field relief region is lightly doped, spaced from said base region and said trenches, and aligned with a respective highly conductive contact region, and wherein each of said highly conductive contact regions of said second conductivity is formed at the bottom of a respective recess formed in said base region, and wherein a region of said first conductivity is located at a respective sidewall of each recess.

6. A device according to claim 5, further comprising a first contact in ohmic contact with said conductive regions of said first conductivity.

7. A device according to claim 6, wherein said first contact is a source contact.

8. A device according to claim 5, wherein said conductive regions of said first conductivity are source regions.

9. A device according to claim 5, further comprising a second contact in ohmic contact with said substrate.

10. A device according to claim 9, wherein said second contact is a drain contact.

11. A device according to claim 5, further comprising another plurality of field relief regions formed at a depth below said plurality of field relief regions.

12. A MOS-gated device comprising:
a substrate of a first conductivity type;
a trench receiving layer which includes a common conduction region of said first conductivity type, and a base region of a second conductivity type formed over said common conduction region;
a plurality of trenches formed to extend below said base region, each trench including a gate insulation layer disposed on at least one side wall thereof and filled with a conductive gate material;
a plurality of source regions each adjacent a respective trench;
a plurality of highly conductive contact regions formed in said base region; and
a plurality of field relief regions of said second conductivity formed in said common conduction region and extending to a depth below said base region; wherein each said field relief region is lightly doped, spaced from said base region and said trenches, and aligned with a respective highly conductive contact region.

13. A device according to claim 12, further comprising a drain contact in ohmic contact with said substrate.

14. A device according to claim 12, further comprising another plurality of field relief regions formed in said common conduction region at a depth below said depth of said plurality of field relief regions.

15. A device according to claim 12, further comprising a first contact in ohmic contact with said source.

* * * * *